(12) United States Patent
Bringivijayaraghavan et al.

(10) Patent No.: US 8,797,080 B2
(45) Date of Patent: Aug. 5, 2014

(54) CIRCUITS, APPARATUSES, AND METHODS FOR DELAY MODELS

(75) Inventors: Venkatraghavan Bringivijayaraghavan, Plano, TX (US); Jason Brown, Allen, TX (US); Tyler J. Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/619,859

(22) Filed: Sep. 14, 2012

(65) Prior Publication Data
US 2014/0077851 A1    Mar. 20, 2014

(51) Int. Cl.
*H03H 11/26*    (2006.01)
(52) U.S. Cl.
USPC ........... 327/270; 327/182; 327/183; 327/261; 327/269; 327/276
(58) Field of Classification Search
USPC ......................................... 327/261, 270, 276
See application file for complete search history.

(56) References Cited

U.S. PATENT DOCUMENTS

| | | | |
|---|---|---|---|
| 7,471,130 B2 | 12/2008 | Gomm et al. | |
| 2002/0176315 A1 | 11/2002 | Graaff | |
| 2009/0302918 A1* | 12/2009 | Sagisaka et al. | 327/239 |
| 2012/0105123 A1 | 5/2012 | Brown et al. | |

OTHER PUBLICATIONS

Mueller, , "Autonomous, Multilevel Ring Tuning Scheme for Post-Silicon Active Clock Deskewing Over Intra-Die Variations", IEEE Transactions on Very Large Scale Integration (VLSI) Systems vol. 19; No. 6, Jun. 2011, 973-986.

* cited by examiner

*Primary Examiner* — John Poos
(74) *Attorney, Agent, or Firm* — Dorsey & Whitney LLP

(57) ABSTRACT

Circuits, apparatuses, and methods are disclosed for delay models. In one such example circuit, a first delay model circuit is configured to provide a first output signal by modeling a delay of a signal through a path. A second delay model circuit is configured to provide a second output signal by modeling the delay of the signal through the path. A compare circuit is coupled to the first and second delay model circuits. The compare circuit is configured to compare a third signal from the first delay model circuit and a fourth signal from the second delay model circuit, and, in response provide an adjustment signal to adjust the delay of the second delay model circuit.

18 Claims, 8 Drawing Sheets

CIRCUITS, APPARATUSES, AND METHODS FOR DELAY MODELS

TECHNICAL FIELD

Embodiments of the invention relate generally to integrated circuits, and more particularly, in one or more of the illustrated embodiments, to delay models.

BACKGROUND OF THE INVENTION

Frequently in integrated circuits, there is a need to model the delay of a signal through a particular path so that, for example, the delay can be matched. As just one example, in a delay-locked loop (DLL), a feedback delay model circuit models the delay of a clock signal through an input and/or an output stage of the DLL. This modeled delay is then used to calibrate the DLL in order to for it to lock an output clock signal with an external clock signal by compensating for the modeled delay. Generally, the more accurate the delay model, the more accurate the DLL and the DLL lock will be, and so it can be advantageous to have a relatively accurate delay model.

Accurate delay models, however, typically consume large amounts of power, which can be disadvantageous due to the cost of and heat generated by such power consumption. One example of a relatively accurate delay model is a circuit that replicates the signal path almost exactly—i.e., the delay model is nearly identical to, though at least partially separate and distinct from, the actual path being modeled. Such an accurate delay model may include a portion of the actual path itself (e.g., when modeling a DLL output delay in the DLL feedback delay model, the accurate delay model may include a portion of the clock distribution circuit) in some but not all such accurate models.

In order to decrease the power consumed by a delay model relative to these accurate delay model circuits, the signal path can instead be modeled with a low power delay model, which may include for example smaller gates and smaller wires (e.g., minimum size gates and wires) than an accurate delay model. The low power model may also include one or more resistors and/or capacitors. These relatively low power delay models can effectively model the delay of a signal through a path while consuming relatively little power as compared with an accurate delay model. However, these low power delay models are typically not as accurate as a model that uses, for example, full size gates and wires that identically match the actual signal path. These low power delay models may not be as accurate due to the fact that, for example, process, temperature, and voltage variations affect a smaller size inverter differently than a much larger inverter. As another example, if different types of materials are used in the low power model than in the path being modeled (e.g., polysilicon is used in the low power model to model a metal wire in the path), process, temperature, and voltage variations can affect the operation of the different materials in different manners.

During design and manufacture, low power delay models can be adjusted in order to model a signal path as best as possible (e.g., can be tuned for a particular voltage and temperature corner). However, this type of adjustment is generally static and cannot be changed once the circuit is manufactured. Hence, if the temperature or voltage of the circuit changes during operation and does not match the parameters used to statically adjust the low power delay model, these dynamic changes will cause the low power delay model to be less accurate due to the disparate effect the temperature and voltage variations have on the low power model as compared with the path being modeled. Similarly, if the process used to manufacture the low power and/or the modeled path is slightly different than expected, the low power delay model may not correctly model the signal path.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
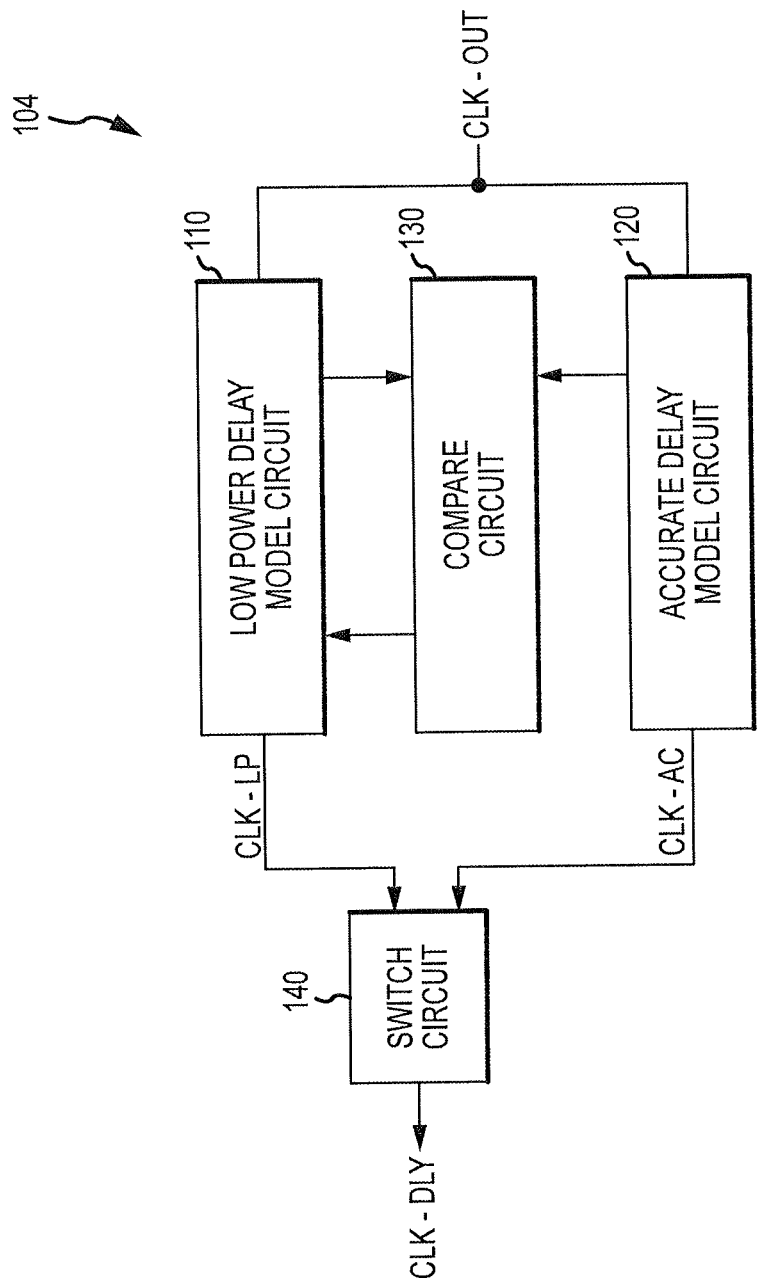
FIG. 1 is a block diagram of a delay model circuit according to an embodiment of the present invention.

FIG. 1 illustrates an apparatus including delay model circuit 104 according to an embodiment of the invention. As used herein, apparatus may refer to, for example, an integrated circuit, a memory device, a memory system, an electronic device or system, a smart phone, a tablet, a computer, a server, etc. The delay model circuit 104 includes a first, accurate delay model circuit 120, a second, low power delay model circuit 110, a compare circuit 130, and a switch circuit 140.

The first, accurate delay model circuit 120 receives a signal CLK-OUT, and provides (e.g., generates, derives, passes through, etc.) a first delayed output signal CLK-AC. The first, accurate delay model circuit 120 models the delay of a signal through a path. As just one example, it may model the output delay (e.g., forward path) of a clock signal in a DLL circuit. The first delay model circuit 120 is "accurate" in that it models the delay of the signal through the path being modeled with relative accuracy—such as with a 0.01%, 0.1%, 1%, or 10% accuracy. The first delay model circuit 120 may achieve this accuracy by, as just one example, including the same size and dimensions of gates, flip-flops, wires, and other components as the path being modeled, which may be referred to as having "full size" components. In some embodiments, the first, accurate delay model circuit 120 may include at least a portion of the path being modeled itself, such as a part of a clock distribution circuit in the case of a DLL. In these embodiments, the first, accurate delay model circuit 120 may be referred to as a "remote" model because the model includes one or more components that are remote (e.g., external) to the model circuit. In other embodiments, however, the first, accurate delay model circuit 120 may not include any components from the actual path being modeled, and may not be "remote," but instead may include, as another example, a complete replica of the path being modeled within the delay model circuit 120 itself.

The second, low power delay model circuit 110 also receives the signal CLK-OUT, and provides a second delayed output signal CLK-LP. The second, low power delay model circuit 110 also models the delay of a signal through a path and generally models the same path as the first, accurate delay model circuit 120. The second delay model circuit 110 is "low power" in that it consumes less power than the first, accurate delay model circuit 120 (for example, may consume 1%, 5%, 10%, 20%, 50%, 80% less power), although the accuracy with which the second, low power delay model circuit 110 models the delay of the signal through its path is typically not as good as the accuracy with which the first, accurate delay model circuit 120 models such delay. The second delay model circuit 110 achieves the lower operating power by including, for example, smaller gates, flip-flops, wires, and other components as compared with those found in the accurate model. In some embodiments, the components may be minimum size in that they are the smallest size allowable by the processing technology that will be used to create the circuit. In addition to receiving the signal CLK-OUT, the second, low power delay model circuit also receives one or more adjustment signals (e.g., one or more tuning signals) from a compare circuit, described below. The one or more adjustment signals adjust the second, low power delay model circuit 110, as described in more detail, below with reference to FIG. 2.

The compare circuit 130 is coupled to both the first, accurate delay model circuit 120 and the second, low power delay model circuit 110 and is configured to compare the two delay model circuits 120, 110. The compare circuit 130 may compare the two delay model circuits 120, 110 in many different manners, such as by comparing the first and second delayed output signals CLK-AC, CLK-LP, by comparing other signals provided by the first and second delay model circuits 120, 110, by comparing a delay induced in each of the delay model circuits 120, 110, and so forth. In some embodiments, the compare circuit 130 may be a phase detector configured to compare the phases of the signals CLK-AC, CLK-LP from the first and second delay model circuits 120, 110. In other examples, the compare circuit 130 may generally be any circuit that can compare the first and second delay model circuits 120, 110 in any manner.

Responsive to the comparison of the first and second delay model circuits, the compare circuit 130 provides an adjustment signal to the second, low power delay model circuit 110, which may be a tuning signal, a feedback signal, and so forth. The second, low power delay model circuit 110 may be adjusted by the adjustment signal to add or remove delay so that it substantially matches the delay in the first, accurate delay model circuit 120, such as within 0.01%, 0.1%, 1%, or 10% accuracy.

In some but not all embodiments, the delay model circuit 104 also includes a switching circuit 140 that is coupled to both the first, accurate delay model circuit 110 and to the second, low power delay model circuit 120. The switching circuit 140 receives the first and second delayed output signals CLK-AC, CLK-LP and a control signal (not shown in FIG. 1) and selectively provides one of the first and second delayed output signals CLK-AC, CLK-LP as the delayed signal CLK-DLY responsive to the control signal.

In operation, the first, accurate delay model circuit 120 models the delay of a signal through a path, and the second, low power delay model circuit 110 similarly models the delay of the signal through the path. The compare circuit 130 compares the first and second delay model circuits 120, 110, and provides the adjustment signal to the second, low power delay model circuit 110 to adjust the delay induced in the second, low power delay model circuit 110 so that it substantially matches (e.g., aligns with, corresponds with, is calibrated with, etc.) the first, accurate delay model circuit 120. Once the adjustment signal adjusts the second, low power delay model circuit 110, one or both of the first, accurate delay model circuit 110 and the compare circuit 130 may, in some embodiments, be turned off to conserve power. In this manner, relatively little power may be consumed by the delay model circuit 104 due to the second, low power delay model circuit 110 consuming less power than a traditional accurate delay model circuit standing alone, but at the same time, the second, low power delay model circuit 110 may nonetheless be more accurate than a low power delay model circuit standing alone due to the calibration of the second, low power delay model circuit 110 with the adjustment signal from the compare circuit 130.

After the first, accurate delay model circuit 110 and/or the compare circuit 130 are turned off, they may in some embodiments be turned back on in order to readjust (e.g., recalibrate) the second, low power delay model circuit due to, for example, changes in operating temperature or changes in supply voltage provided to the delay model circuit 104. In other embodiments, however, no such readjustment takes place until at least power off of the entire circuit, and the delay model circuit 104 therefore maintains the adjustment initially provided.

In those delay model circuits 140 that include a switching circuit 140, the switching circuit 140 may initially provide the first delayed signal CLK-AC as the delayed signal CLK-DLY, and subsequently switch to providing the second delayed signal CLK-LP as the delayed signal CLK-DLY. In other embodiments without a switching circuit (not illustrated), the first delayed signal CLK-AC may never be provided as the delayed signal CLK-DLY, and instead, the second clock signal CLK-LP may always be provided as the delayed signal CLK-DLY. In still another embodiment (not illustrated), the switching circuit 140 may not provide a delayed signal CLK-DLY until the adjustment of the second, low power delay model circuit is complete, upon which the switching circuit 140 provides the second delayed signal CLK-LP as the delayed signal CLK-DLY.

Figure 2:
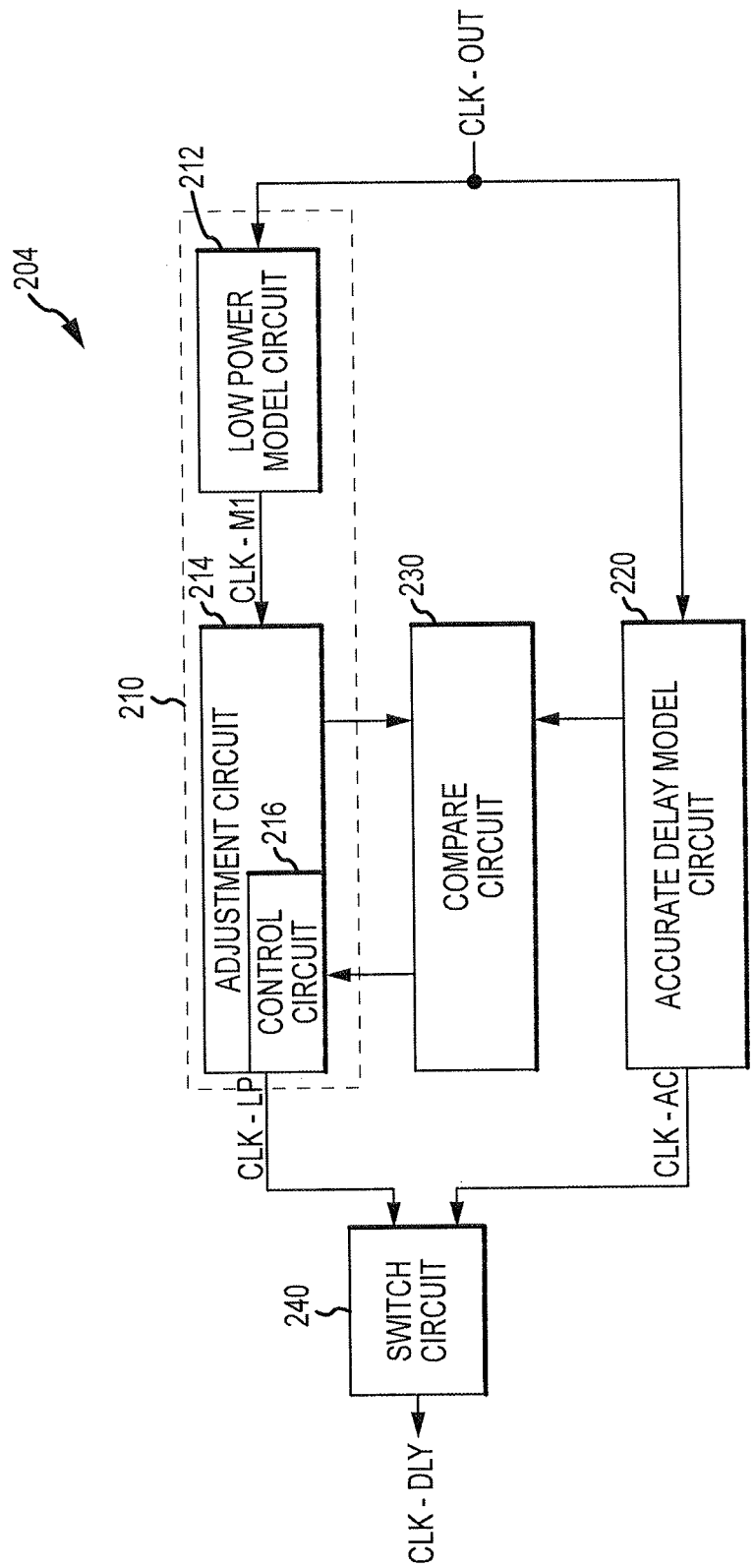
FIG. 2 is a block diagram of a delay model circuit according to an embodiment of the invention.

FIG. 2 illustrates an apparatus including a delay model circuit 204 according to an embodiment of the invention. The delay model circuit 204 illustrated in FIG. 2 includes many of the same elements and operates in much the same manner as the delay model circuit 104 illustrated in FIG. 1, with similar elements labeled with similar reference numerals. The second, low power delay model circuit 210 in FIG. 2 includes a low power model circuit 212, and an adjustment circuit 214. The low power model circuit 212 may include, for example, reduced size components as described above, and may generally be unadjustable. In other embodiments, the low power model circuit 212 may be adjustable through test modes and the like.

The adjustment circuit 214 includes a control circuit 216 that receives the adjustment signal from the compare circuit 230. In some embodiments, the control circuit 216 includes one or more storage locations (e.g., a register) to store one or more values representative of the adjustment signal and/or adjustment that needs to be made in the adjustment circuit 214. The control circuit 216 may also generate one or more control signals to control the adjustment circuit, a few examples of which are described below with reference to FIG. 7. The adjustment circuit 214 may include coarse delay elements, fine tuning delay elements, or both coarse and fine tuning delay elements, and the control signal(s) may serve to enable/disable the coarse and/or fine tuning delay elements such that they do or do not adjust the delay added to the signal CLK-M1 in providing the second delayed signal CLK-LP.

In operation, the adjustment circuit 214 receives a signal CLK-M1 provided by the low power model circuit 212 and the adjustment signal(s) provided by the compare circuit 230. In response, the adjustment circuit 214 adjusts the delay of the signal CLK-M1 to provide the second delayed signal CLK-LP.

Figure 3:
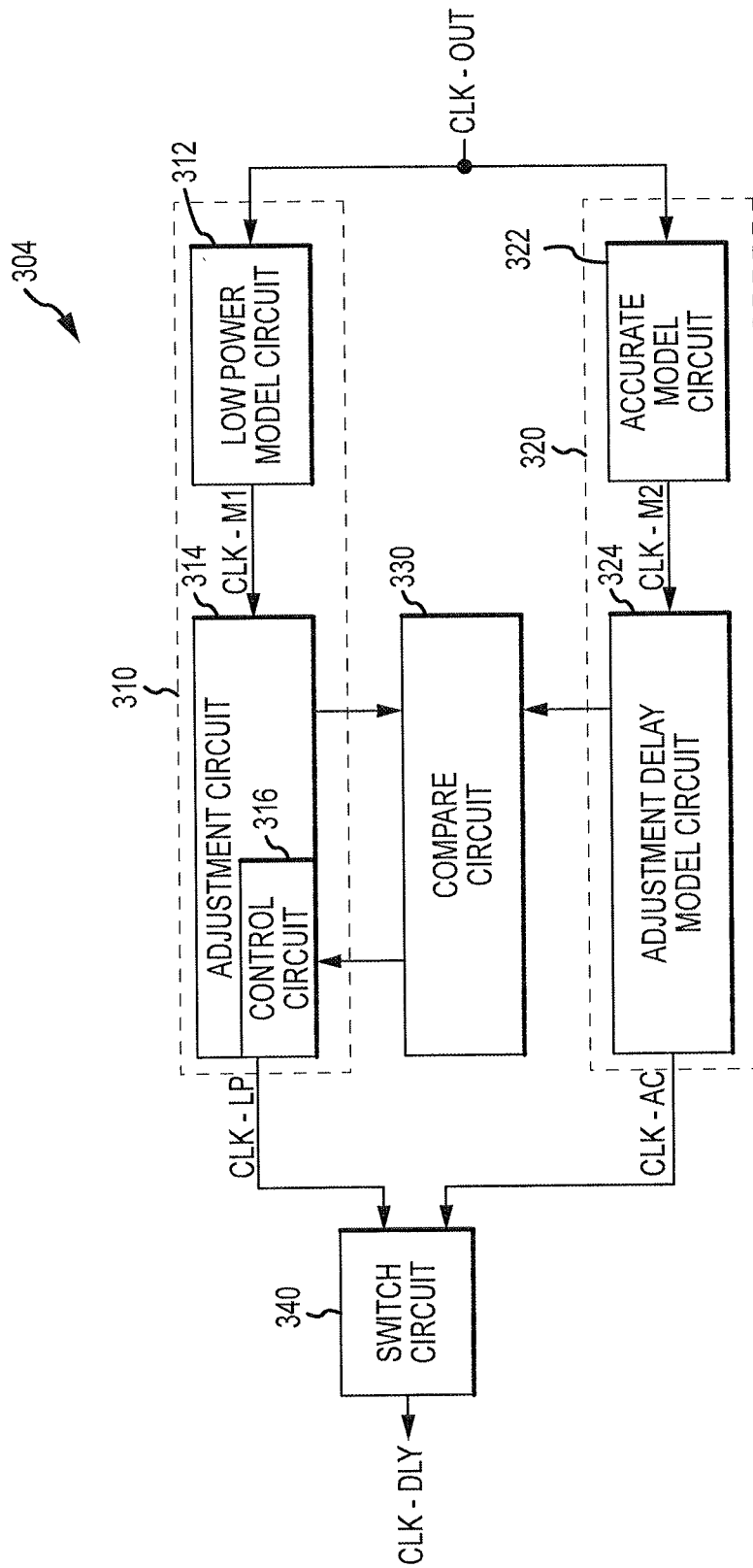
FIG. 3 is a block diagram of a delay model circuit according to an embodiment of the invention.

FIG. 3 illustrates an apparatus including delay model circuit 304 according to an embodiment of the invention. The delay model circuit 304 illustrated in FIG. 3 includes many of the same elements and operates in much the same manner as the delay model circuit 204 illustrated in FIG. 2, with similar elements labeled with similar reference numerals. The first, accurate delay model circuit 320 includes an accurate model circuit 322 and an adjustment delay model circuit 324. The accurate model circuit 322 includes the gates, flip-flops, and so forth that model the signal path itself in a relatively accurate manner. The adjustment delay model circuit 325 models the adjustment circuit 310 in the second, low power delay model circuit 310, and acts as a set-to-midpoint circuit. In other words, the adjustment delay model circuit 324 adds a delay to the CLK-M2 signal that is approximately equivalent to the midpoint of the tuning window of the adjustment circuit 314. In this manner, the adjustment circuit 314 in the second, low power delay model circuit 310 can both add or remove a delay relative to the first, accurate delay model circuit 320 without pre-skewing the first delay signal CLK-AC.

Figure 4:
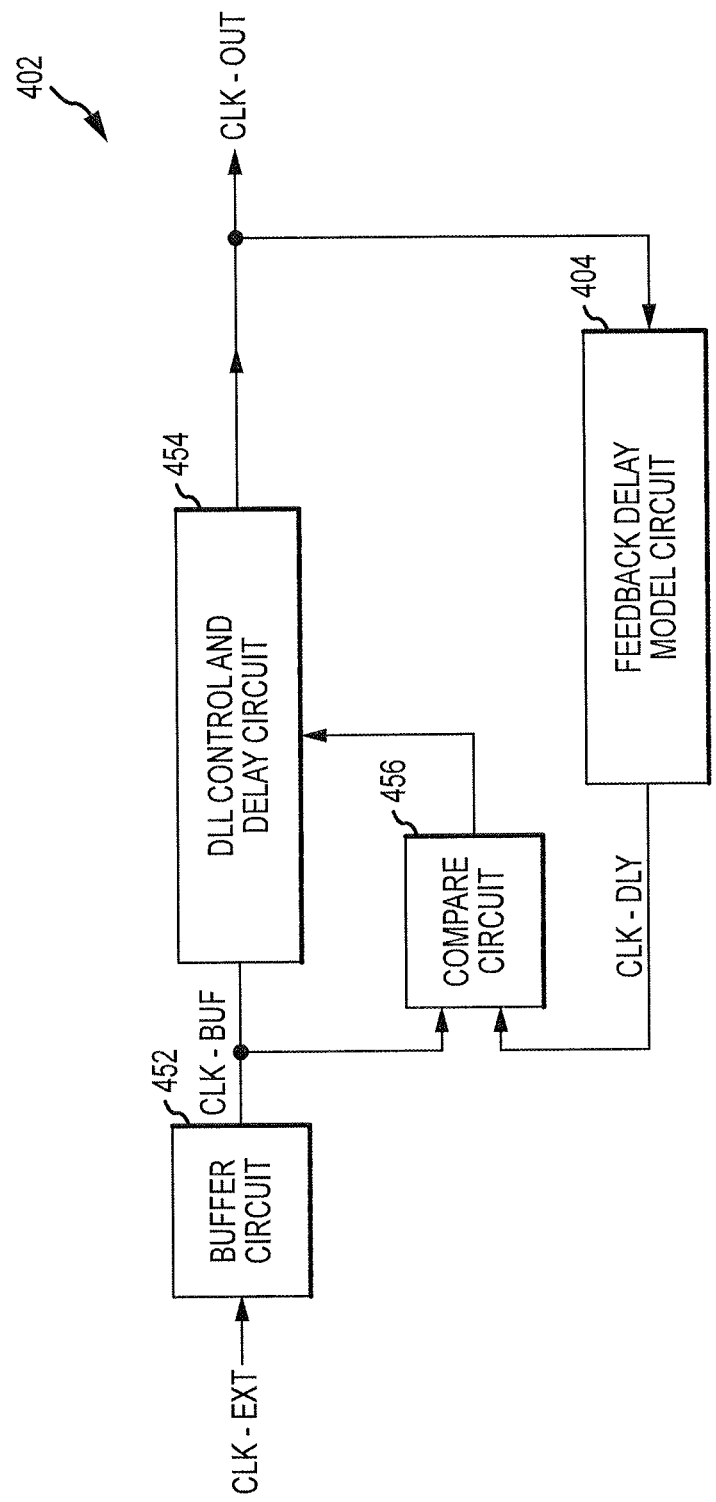
FIG. 4 is a block diagram of a DLL according to an embodiment of the invention.

FIG. 4 illustrates a delay locked loop (DLL) 402 according to an embodiment of the invention. The DLL 402 includes a buffer circuit 452 that receives an external clock signal CLK-EXT and provides a buffered clock signal CLK-BUF in response. The DLL 402 also includes a DLL control and delay circuit 454, which receives the buffered clock signal and a control signal, and provides an output clock signal CLK-OUT in response. The DLL 402 also includes a feedback delay model circuit 404, which may include any of the delay model circuits 104, 204, 304 illustrated in FIGS. 1, 2, and 3, and which may model the delay of the output and/or the input path of the DLL 402. The DLL 402 also includes a compare circuit 456, such as a phase detector, that compares the delayed clock signal CLK-DLY provided by the feedback delay model circuit 404 and the buffered clock signal CLK-BUF provided by the buffer circuit 452, and provides the control signal to the DLL control and delay circuit 454. In operation, the DLL 402 locks the delayed clock signal CLK-DLY to the buffered clock signal CLK-BUF by comparing the delayed clock signal CLK-DLY and the buffered clock signal CLK-BUF and adjusting a variable delay added to the buffered clock signal CLK-BUF by the DLL control and delay circuit 454. Under a locked condition with the CLK-BUF and CLK-DLY signals in phase, a clock signal (not shown), which results from the CLK-OUT propagated through an output clock path (the output clock path having a delay that is modeled in part by the feedback delay model circuit), will be in phase with the CLK-EXT signal.

Figure 5:
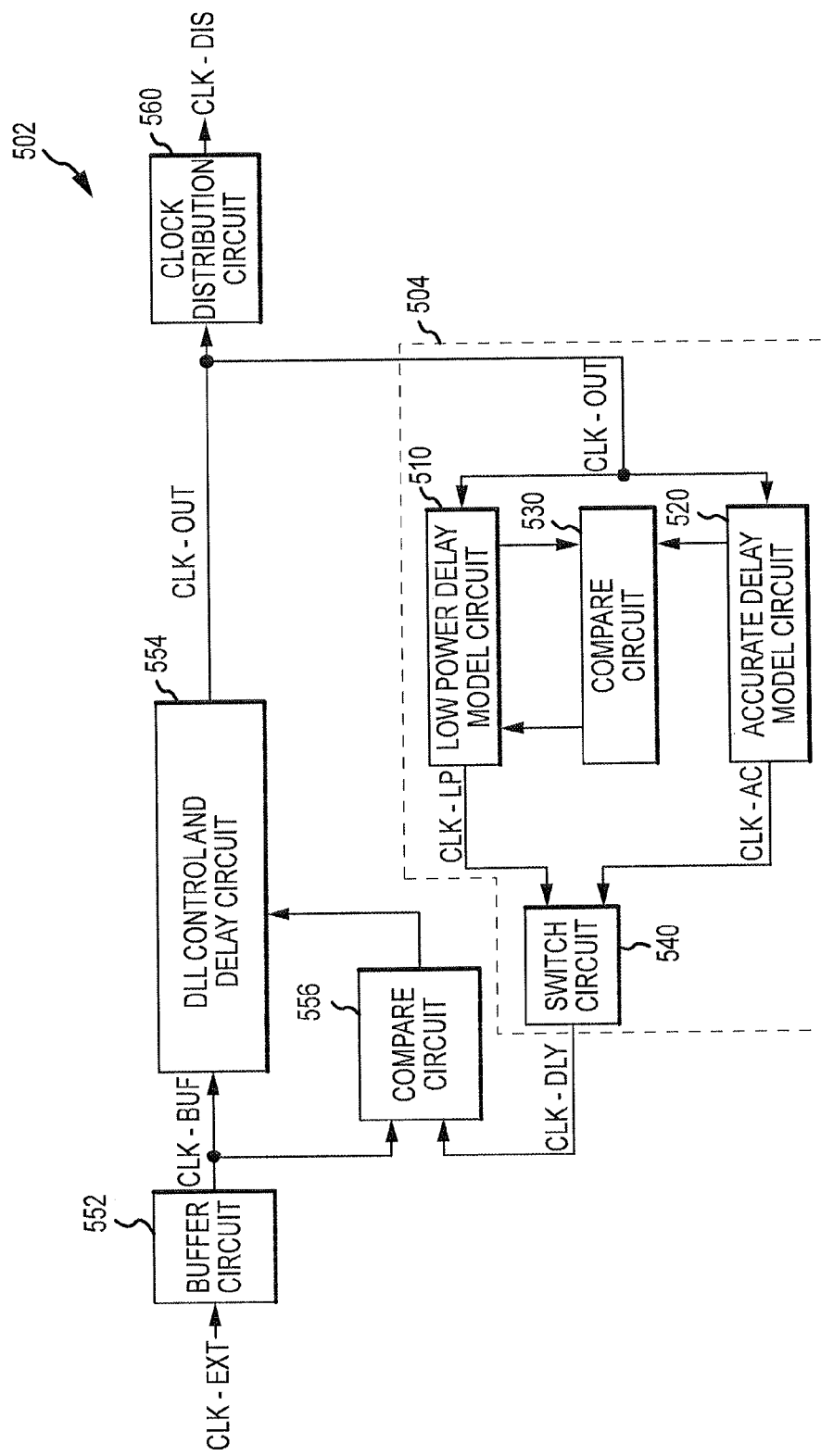
FIG. 5 is a block diagram of a DLL according to an embodiment of the invention.

FIG. 5 illustrates a DLL 502 according to an embodiment of the invention, which includes a delay model circuit 504 similar to the delay model circuit 104 illustrated in FIG. 1 and described above. FIG. 5 also includes a clock distribution circuit 560 that provides a clock distribution signal CLK-DIS responsive to the output clock signal CLK-OUT. In FIG. 5, the clock distribution circuit 560 is not included within the accurate delay model circuit 520 and both the clock distribution circuit 560 and the delay model circuit 504 receive the CLK-OUT signal from the DLL control and delay circuit 554.

In operation the accurate delay model circuit 520 models a feedback delay for the DLL 502 and provides a first delayed clock signal CLK-AC. During initialization of the DLL 502, the switch circuit 540 provides the delayed clock signal CLK-DLY responsive to the accurate delay model circuit 520. Simultaneous with the initialization of the DLL 502, the compare circuit 530 and the low power delay model circuit 510 operate together to compare and adjust the delay of the low power delay model circuit 510 so that it matches the delay of the accurate delay model circuit 520. After the DLL 502 is initialized, and the delay of the low power delay model circuit 510 is adjusted, the switch circuit 540 switches the feedback delay model circuit 504 to provide the second delayed clock signal CLK-LP as the feedback delay for use by the DLL 502. Also, the accurate delay model circuit 520 and the compare circuit 530 may be turned off after the second, low power delay model circuit 510 is properly adjusted and switched.

In other embodiments, however, the switching circuit 540 may switch the feedback delay model circuit 504 to provide the second delayed clock signal CLK-LP as the feedback delay for use by the DLL 502 during initialization of the DLL 502, or even before initialization of the DLL begins. In other words, the switching of the low power delay model circuit 510 for the accurate delay model circuit 520 can occur before, during, or after the DLL lock initialization.

In general, the adjustment of the low power delay model circuit 510 in the feedback delay model circuit 504 may be optional (e.g., enableable). Also, the low power delay model circuit 510 may be adjusted at various times, for example, at the start or exit of every self-refresh mode when used in a memory.

Figure 6:
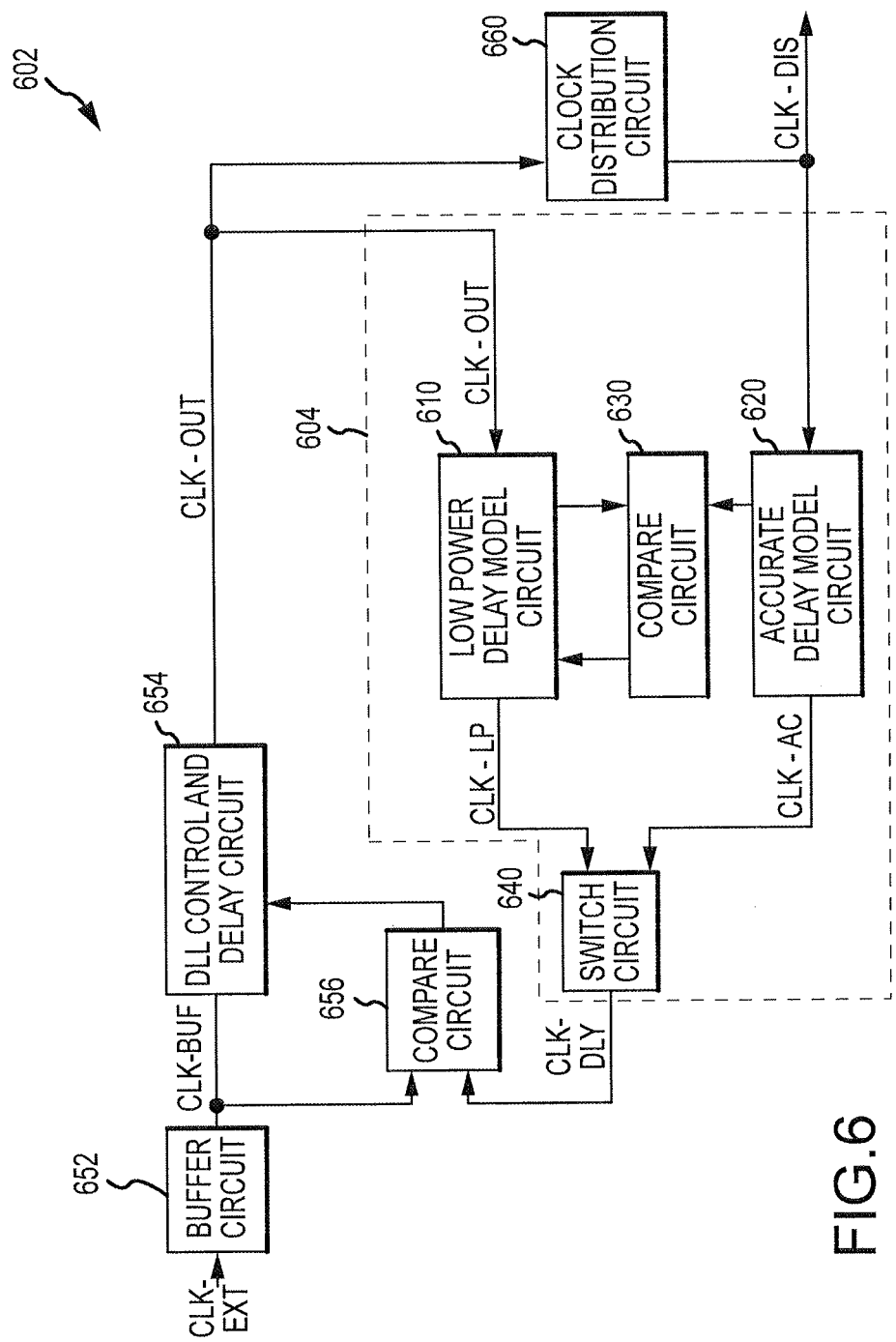
FIG. 6 is a block diagram of a DLL according to an embodiment of the invention.

FIG. 6 illustrates a DLL 602 according to an embodiment of the invention, which includes a delay model circuit 604 similar to the delay model circuit 104 illustrated in FIG. 1 and described above. The DLL 602 also includes a clock distribution circuit 660, which provides a distribution clock signal CLK-DIS as the input to the accurate delay model circuit 620, whereas the low power delay model circuit 610 receives as input the signal CLK-OUT from the DLL control and delay circuit 654. In this "remote" modeling example, the accurate delay model circuit 620 models less of a signal path than would be the case if the input provided to the accurate delay model circuit 620 was the signal CLK-OUT from the DLL control and delay circuit 654 (similar to the arrangement in FIG. 5).

Figure 7:
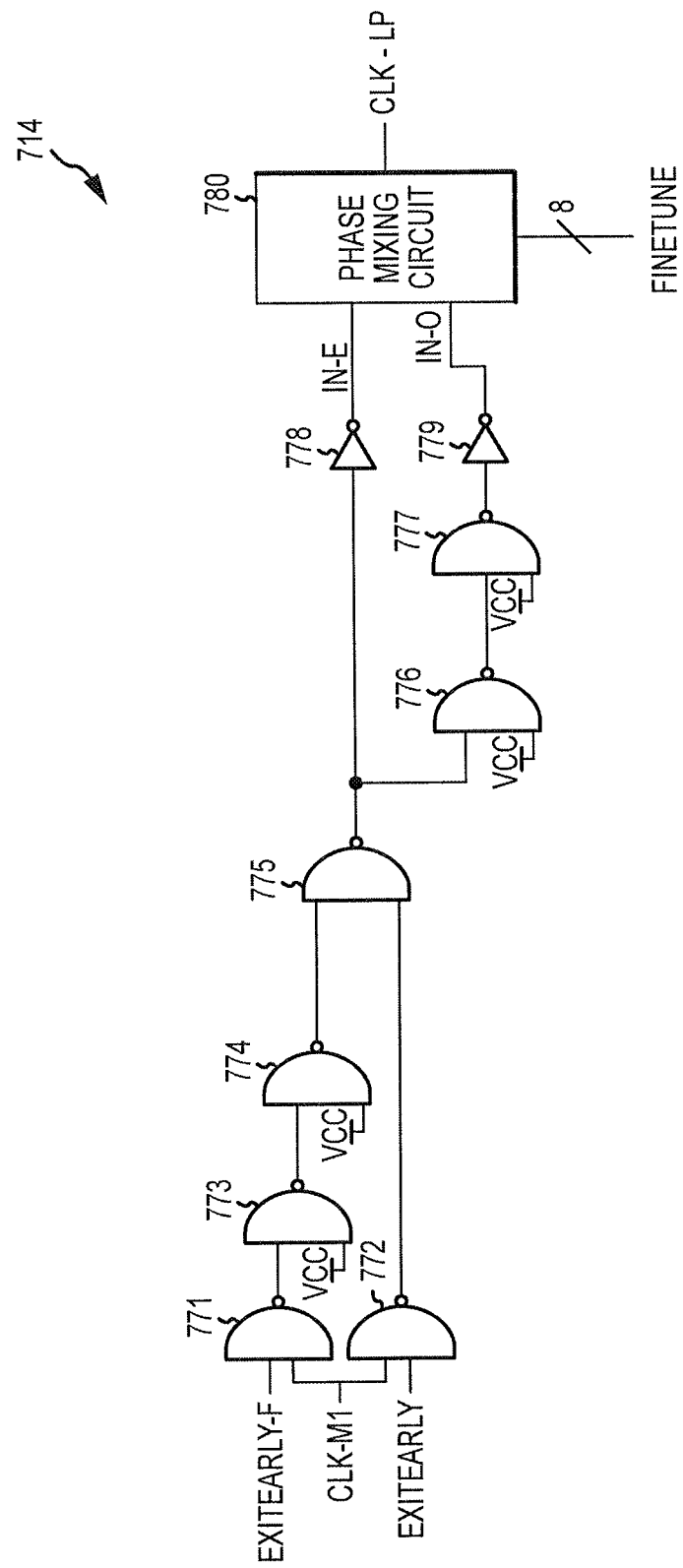
FIG. 7 is a partial schematic diagram of an adjustment circuit according to an embodiment of the invention.

FIG. 7 illustrates a portion of an adjustment circuit 714 according to an embodiment of the invention. The portion of the adjustment circuit 714 of FIG. 7 may be included in the adjustment circuits 214, 314 illustrated in FIGS. 2 and 3. The adjustment circuit 714 includes a plurality of NAND gates 771-777 that together function as a coarse delay element. The adjustment circuit 714 also includes a phase mixing circuit 780 that functions as a fine tuning delay element. In general, the coarse delay and fine tuning delay elements may in some but not all embodiments be similar to coarse delay and fine tuning elements in the delay line of the DLL control and delay circuit 654 in FIG. 6. For example, the coarse delay element in both the adjustment circuit 714 and the delay line may be a pair of NAND gates in some embodiments, and the fine tuning element may be a phase mixing circuit.

The first two NAND gates 771, 772 each receive the CLK-M1 signal from, for example, the low power model circuit 612 in FIG. 6. The top NAND gate 771 also receives a control signal EXITEARLY-F, and the bottom NAND gate 772 receives a control signal EXITEARLY. The EXITEARLY and EXITEARLY-F signals may be complementary to each other, i.e., they always have opposite logic values compared to one another. The top NAND gate 771 is serially coupled to NAND gates 773, 774, 775, and the bottom NAND gate 772 is directly coupled to NAND gate 775. The output of NAND gate 775 is in turn coupled to an inverter 778 which provides the IN-E signal to the phase mixing circuit 780. The output of NAND gate 775 is also serially coupled to NAND gates 776, 777, with the output of NAND gate 777 coupled to inverter 779, which in turn provides the IN-O signal to the phase mixing circuit 780. In addition to receiving the IN-E and the IN-O signals, the phase mixing circuit 780 also receives a control signal FINETUNE, which may be 8 bits wide in some embodiments. The phase mixing circuit 780 provides the delayed clock signal CLK-LP responsive to the IN-E, IN-O, and FINETUNE signals.

In operation, responsive to EXITEARLY being logic low and EXITEARLY-F being logic high, NAND gate 772 provides a logic high signal to the bottom input node of NAND gate 775 in FIG. 7. In this manner, the signal CLK-M1 will toggle all the way through each of the NAND gates 771, 773, 774, 775, 776, 777, the IN-E signal will be provided to the phase mixing circuit 780 with a 5 gate delay (1 inverter and 4 NAND gates) relative to the CLK-M1 signal, and the IN-O signal will be provided to the phase mixing circuit 780 with a 7 gate delay (1 inverter and 6 NAND gates). Then, responsive to the control signal FINETUNE provided by a control circuit (e.g., control circuit 316 in FIG. 3), the phase mixing circuit 780 provides the delayed signal CLK-LP responsive to a phase relationship relative to the IN-O and IN-E signals as controlled by the control signal FINETUNE. The phase mixing circuit 780 combines the IN-O and IN-E signals according to the weight given them by the control signal FINETUNE. Thus the phase mixing circuit 780 phase mixes within one coarse delay stage, which in the illustrated embodiment is 2 NAND gates.

In operation, responsive to EXITEARLY being logic high and EXITEARLY-F being logic low, NAND gate 774 provides a logic high signal to the top input node of NAND gate 775 in FIG. 7. In this manner, the signal CLK-M1 will toggle through each of the NAND gates 772, 775, 776, 777, and the IN-E signal will be provided to the phase mixing circuit 780 with a 3 gate delay (1 inverter and 2 NAND gates) relative to the CLK-M1 signal, and the IN-O signal will be provided to the phase mixing circuit 780 with a 5 gate delay (1 inverter and 4 NAND gates). Then, responsive to the control signal FINETUNE, the phase mixing circuit 780 provides the delayed signal CLK-LP responsive to a phase relationship relative to the IN-O and IN-E signals as controlled by the control signal FINETUNE.

In this manner, the adjustment circuit 714 can add or remove a delay of approximately 2 NAND gates (+/−2 g) to the second, low power delay signal CLK-LP relative to the first, accurate delay signal CLK-AC. The granularity of the delay added or removed is determined by the width of the control signal FINETUNE.

The sequencing of the EXITEARLY, EXITEARLY-F, and FINETUNE signals may be determined by a control circuit, such as the control circuit 616 in FIG. 6, and may vary depending on the nature and implementation of the circuit. By way of example, the sequencing may be a bisection-type algorithm, whereby the "best" delay is achieved by sequentially bisecting intervals.

The extra delay added by the adjustment circuit 714 may in some embodiments be compensated elsewhere. In some embodiments, the NAND gates 773, 774, the NAND gates 776, 777, the inverters 778, 779, and the phase mixing circuit 780 may correspond to similar elements in the clock distribution tree, for example, and the NAND gates 771, 772, 775 may correspond to similar elements in a clock generation circuit.

In general, the tuning window and granularity of adjustments available by the adjustment circuit 714 may vary depending on the implementation, and may be determined based on simulation of the low power delay model circuit during design. In some embodiments, one or more capacitors may be coupled to the NAND gates in FIG. 7 (not shown) to increase the tuning window, with the capacitors being controllable by, for example, test modes.

Figure 8:
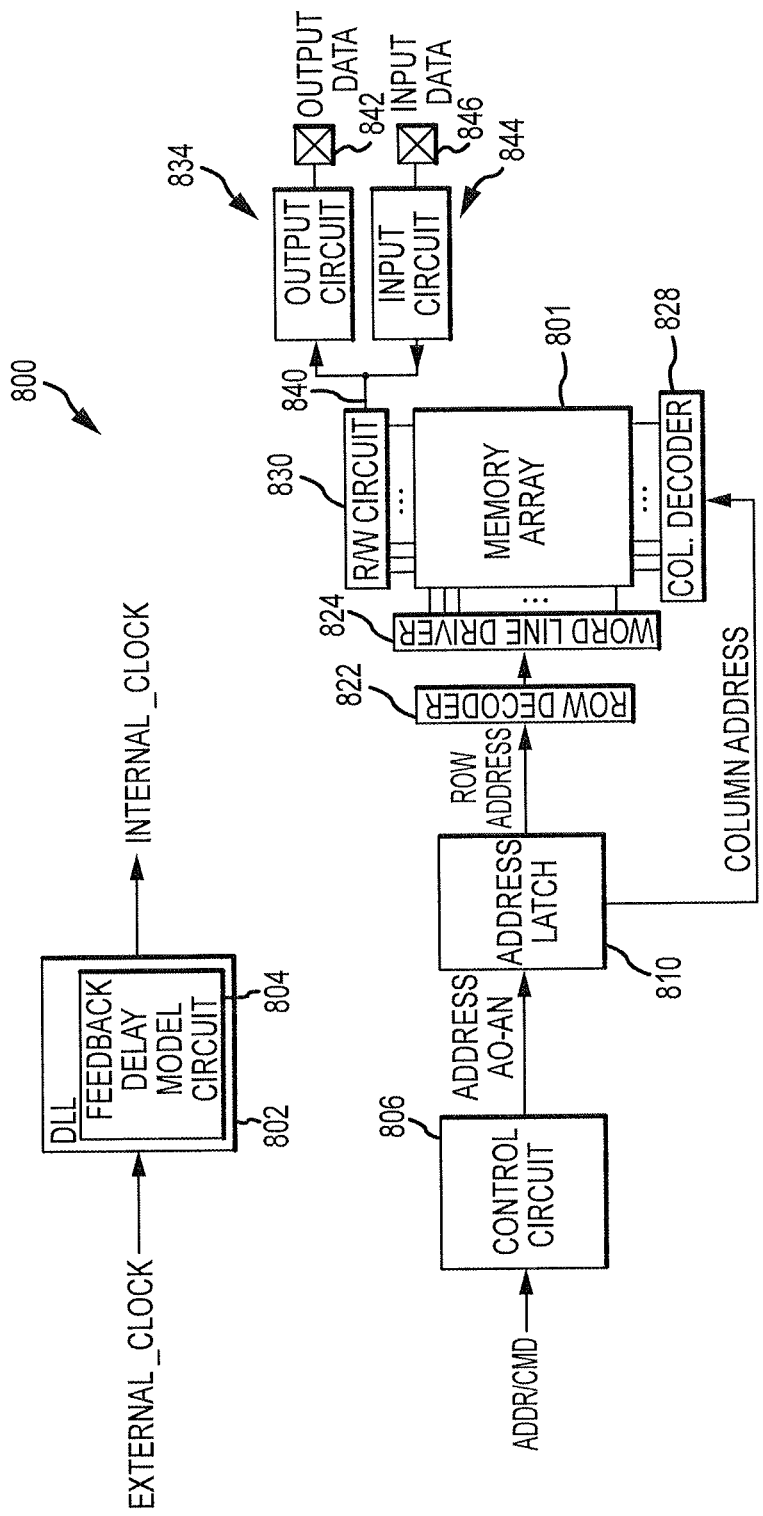
FIG. 8 is a block diagram of a memory according to an embodiment of the invention.

FIG. 8 illustrates a portion of a memory 800 according to an embodiment of the present invention. The memory 800 includes an array 801 of memory cells, which may be, for example, DRAM memory cells, SRAM memory cells, flash memory cells, or some other types of memory cells. The memory 800 includes a control circuit 806 that receives memory commands and addresses through an ADDR/CMD bus. The control circuit 806 provides control signals, based on the commands received through the ADDR/CMD bus. The control circuit 806 also provides row and column addresses to the memory 800 through an address bus and an address latch 810. The address latch then outputs separate column addresses and separate row addresses.

The row and column addresses are provided by the address latch 810 to a row address decoder 822 and a column address decoder 828, respectively. The column address decoder 828 selects bit lines extending through the array 802 corresponding to respective column addresses. The row address decoder 822 is connected to word line driver 824 that activates respective rows of memory cells in the array 802 corresponding to received row addresses. The selected data line (e.g., a bit line or bit lines) corresponding to a received column address are coupled to a read/write circuitry 830 to provide read data to a data output circuit 834 via an input-output data bus 840. An output pad 842 coupled to the data output circuit 834 is used for electrically coupling to the memory 800. Write data are provided to the memory array 802 through a data input circuit 844 and the memory array read/write circuitry 830. An input pad 846 coupled to the data input circuit 842 is used for electrically coupling to the memory 800. The control circuit 806 responds to memory commands and addresses provided to the ADDR/CMD bus to perform various operations on the memory array 802. In particular, the control circuit 806 is used to provide internal control signals to read data from and write data to the memory array 802.

The memory 800 in FIG. 8 also includes a DLL 802 that may be, for example, any of the DLLs 402, 502, 602 described herein in connection with FIG. 4, 5, or 6, or a similar DLL. The DLL 802 may include a feedback delay model circuit 804 that may be any of the delay model circuits 104, 204, 304, 404, 504, 604 described herein, or a similar circuit. The feedback delay model circuit 804 may be configured to model the delay of the output and/or input of the DLL 802 in the feedback path of the DLL 802.

From the foregoing it will be appreciated that, although specific embodiments of the invention have been described herein for purposes of illustration, various modifications may be made without deviating from the spirit and scope of the invention. For example, FIGS. 1, 2, 3, 4, 5, 6, and 8 illustrate embodiments 104, 204, 304, 404, 504, 604, 804 of a delay model circuit, FIGS. 4, 5, 6, and 8 illustrate embodiments 402, 502, 602, 802 of a DLL circuit, and so forth. However, other delay model circuits, DLLs, and so forth may be used, which are not limited to having the same design, and may be of different designs and include circuitry different from the circuitry in the embodiments illustrated in these figures.

Although FIG. 7 illustrates one example of an adjustment circuit, many other types of adjustment circuits may be used, including adjustment circuits with coarse and/or fine tuning, or even single stage tuning. Furthermore, although several figures have been described with reference to a DLL clock generation circuit, the delay model circuits described herein may be used in other clock generation circuits (e.g., a phase locked loop), or in general in any circuit where delay modeling is needed.

Accordingly, the invention is not limited except as by the appended claims.

What is claimed is:

1. A circuit, comprising:
   a first delay model circuit configured to provide a first output signal by modeling a delay of a signal through a path;
   a second delay model circuit configured to provide a second output signal by modeling the delay of the signal through the path;
   a switch circuit coupled to the first and second delay model circuits and configured to select between the first and second output signals to provide a delayed output signal; and
   a compare circuit coupled to the first and second delay model circuits and configured to compare a third signal from the first delay model circuit and a fourth signal from the second delay model circuit, and, in response provide an adjustment signal to adjust the delay of the second delay model circuit.

2. The circuit of claim 1, wherein the third signal comprises the first output signal and the fourth signal comprises the second output signal.

3. The circuit of claim 1, wherein the second delay model circuit is configured to adjust the modeling of the delay responsive to the adjustment signal.

4. The circuit of claim 1, wherein the second delay model circuit is configured to consume less power than the first delay model circuit.

5. The circuit of claim 1, wherein the adjustment signal comprises a tuning signal.

6. The circuit of claim 1, wherein the second delay model circuit comprises an adjustment circuit configured to receive the adjustment signal and, in response, add or remove delay in the adjustment circuit in providing the second output signal.

7. The circuit of claim 6, wherein the adjustment circuit comprises a control circuit configured to receive the adjustment signal and, in response, add or remove delay in the adjustment circuit.

8. The circuit of claim 6, wherein the first delay model circuit comprises an adjustment delay model circuit configured to model a delay of the adjustment circuit in the second delay model circuit.

9. An apparatus, comprising:
   a compare circuit configured to compare a first delay model and a second delay model and provide an adjustment signal responsive thereto; and
   an adjustment circuit coupled to the compare circuit and configured to adjust coarse tune and fine tune the second delay model responsive to the adjustment signal.

10. The apparatus of claim 9, wherein the compare circuit comprises a phase detector.

11. The apparatus of claim 9, wherein the adjustment circuit comprises a phase mixing circuit configured to fine tune the second delay model.

12. A method, comprising:
   providing a first delayed signal by modeling a path in a first delay model circuit;
   providing a second delayed signal by modeling the path in a second delay model circuit;
   providing the first delayed signal as an output signal;
   providing an adjustment signal responsive to comparing the first delayed signal and the second delayed signal;
   adjusting the second delay model circuit to provide an adjusted delayed signal responsive to the adjustment signal; and
   switching to provide the adjusted delayed signal as the output signal.

13. The method of claim 12, further comprising selectively providing the adjusted delayed signal responsive to said adjusting being complete.

14. The method of claim 12, wherein the adjustment signal is provided responsive to comparing a first phase of the first delayed signal and a second phase of the second delayed signal.

15. A method, comprising:
   comparing a first signal provided by a first delay model circuit and a second signal provided by a second delay model circuit;
   providing the first signal as an output signal;
   providing an adjustment signal responsive to the comparing;
   adjusting the second delay model circuit responsive to the adjustment signal; and
   switching to provide an adjusted output of the second delay model circuit as a clock signal.

16. The method of claim 15, wherein a non-adjusted output of the first delay model is initially provided as a clock signal and, after the second delay model circuit is adjusted, further comprising providing the adjusted output of the second delay model as the clock signal.

17. The method of claim 15, wherein the first and second delay model circuits model an input delay, an output delay, or both input and output delays in a clock generation circuit.

18. A circuit, comprising:
   a first delay model circuit configured to provide a first output signal by modeling a delay of a signal through a path;
   a second delay model circuit configured to provide a second output signal by modeling the delay of the signal through the path, wherein the second delay model circuit is configured to consume less power than the first delay model circuit; and
   a compare circuit coupled to the first and second delay model circuits and configured to compare a third signal from the first delay model circuit and a fourth signal from the second delay model circuit, and, in response provide an adjustment signal to adjust the delay of the second delay model circuit.

* * * * *